US008105472B2

(12) United States Patent
Garbar et al.

(10) Patent No.: US 8,105,472 B2
(45) Date of Patent: Jan. 31, 2012

(54) ENHANCED TRANSPARENT CONDUCTIVE COATINGS AND METHODS FOR MAKING THEM

(75) Inventors: Arkady Garbar, Minnetonka, MN (US); Claudio Rottman, Modieen (IL); Fernando De La Vega, Zichron Yacov (IL); Jon Brodd, Stillwater, MN (US)

(73) Assignee: Cima NanoTech Israel Ltd., Caesarea (IL)

( * ) Notice: Subject to any disclaimer, the term of this patent is extended or adjusted under 35 U.S.C. 154(b) by 370 days.

(21) Appl. No.: 11/917,126

(22) PCT Filed: Jun. 9, 2006

(86) PCT No.: PCT/US2006/022456
§ 371 (c)(1),
(2), (4) Date: Dec. 10, 2007

(87) PCT Pub. No.: WO2006/135735
PCT Pub. Date: Dec. 21, 2006

(65) Prior Publication Data
US 2010/0200407 A1   Aug. 12, 2010

Related U.S. Application Data

(60) Provisional application No. 60/690,062, filed on Jun. 10, 2005.

(51) Int. Cl.
*C25D 5/02* (2006.01)
(52) U.S. Cl. .................................................. 205/118

(58) Field of Classification Search .................. 205/126, 205/166, 183, 118; 427/180; 428/1.4
See application file for complete search history.

(56) References Cited

U.S. PATENT DOCUMENTS

| | | | |
|---|---|---|---|
| 4,507,181 A | 3/1985 | Nath et al. | |
| 5,631,111 A | 5/1997 | Niu et al. | |
| 5,972,193 A * | 10/1999 | Chou et al. | 205/122 |
| 5,998,011 A | 12/1999 | Hattori et al. | |
| 6,012,658 A | 1/2000 | Khasin et al. | |
| 6,036,889 A | 3/2000 | Kydd | |
| 6,059,871 A | 5/2000 | Boils et al. | |
| 6,086,790 A | 7/2000 | Hayashi et al. | |
| 6,091,151 A | 7/2000 | Takatsuji et al. | |
| 6,099,630 A | 8/2000 | Kobayashi et al. | |
| 6,104,530 A | 8/2000 | Okamura et al. | |
| 6,106,600 A | 8/2000 | Lecheheb et al. | |
| 6,117,366 A | 9/2000 | Park et al. | |
| 6,118,072 A | 9/2000 | Scott | |
| 6,120,590 A | 9/2000 | Miyamoto et al. | |

(Continued)

FOREIGN PATENT DOCUMENTS
EP    0 977 212    2/2000
(Continued)

OTHER PUBLICATIONS

Alger, *Polymer Science Directory*, 1997, 2$^{nd}$ edition, pp. 411-412.
(Continued)

*Primary Examiner* — Luan Van
(74) *Attorney, Agent, or Firm* — Fish & Richardson P.C.

(57) ABSTRACT

Transparent conductive coated devices (films, three dimensional objects and others) produced through coating with a nano metal containing emulsion which forms a conductive pattern with enhanced electrical, optical and other properties.

3 Claims, 3 Drawing Sheets

U.S. PATENT DOCUMENTS

| | | | |
|---|---|---|---|
| 6,136,228 A | 10/2000 | Hirai et al. | |
| 6,143,418 A | 11/2000 | Takamiya et al. | |
| 6,149,720 A | 11/2000 | Asada et al. | |
| 6,156,109 A | 12/2000 | Asada | |
| 6,180,030 B1 | 1/2001 | Hirai et al. | |
| 6,190,731 B1 | 2/2001 | Tecle | |
| 6,203,925 B1 | 3/2001 | Attard et al. | |
| 6,207,081 B1 | 3/2001 | Sasaki et al. | |
| 6,207,266 B1 | 3/2001 | Kanbara et al. | |
| 6,214,259 B1 | 4/2001 | Oda et al. | |
| 6,261,479 B1 | 7/2001 | Yukinobu et al. | |
| 6,294,111 B1 | 9/2001 | Shacklett, III et al. | |
| 6,294,401 B1 | 9/2001 | Jacobson et al. | |
| 6,335,056 B1 | 1/2002 | Lee et al. | |
| 6,340,817 B1 | 1/2002 | Gelbart | |
| 6,356,234 B1 | 3/2002 | Harrison et al. | |
| 6,379,745 B1 | 4/2002 | Kydd et al. | |
| 6,398,985 B2 | 6/2002 | Yukinobu et al. | |
| 6,416,174 B1 | 7/2002 | Ito et al. | |
| 6,416,818 B1 | 7/2002 | Aikens et al. | |
| 6,447,909 B1 | 9/2002 | Kato et al. | |
| 6,451,433 B1 | 9/2002 | Oka et al. | |
| 6,495,005 B1 | 12/2002 | Colgan et al. | |
| 6,517,931 B1 | 2/2003 | Fu | |
| 6,528,112 B2 | 3/2003 | Kato et al. | |
| 6,538,047 B1 | 3/2003 | Miyabayashi | |
| 6,544,371 B2 | 4/2003 | Senoo et al. | |
| 6,558,581 B2 | 5/2003 | Yukinobu et al. | |
| 6,566,665 B2 | 5/2003 | Baglin et al. | |
| 6,569,359 B2 | 5/2003 | Yukinobu et al. | |
| 6,632,589 B2 | 10/2003 | Inno et al. | |
| 6,673,142 B2 | 1/2004 | Tofuku et al. | |
| 6,679,971 B2 | 1/2004 | Tone et al. | |
| 6,686,249 B1 | 2/2004 | Yukinobu et al. | |
| 6,686,536 B2 | 2/2004 | Tone et al. | |
| 6,689,189 B1 | 2/2004 | Gornerup | |
| 6,712,998 B2 | 3/2004 | Kato | |
| 6,716,480 B2 | 4/2004 | Yukinobu et al. | |
| 6,751,083 B1 | 6/2004 | Gleiter et al. | |
| 6,777,872 B2 | 8/2004 | Aoki et al. | |
| 6,780,772 B2 | 8/2004 | Uzoh et al. | |
| 6,784,223 B2 | 8/2004 | Krohn | |
| 6,808,654 B2 | 10/2004 | Hayashi et al. | |
| 6,878,184 B1 | 4/2005 | Rockenberger et al. | |
| 6,884,936 B2 | 4/2005 | Takahashi et al. | |
| 6,891,324 B2 | 5/2005 | Dorfman | |
| 6,911,385 B1 | 6/2005 | Haubrich et al. | |
| 6,921,626 B2 | 7/2005 | Ray et al. | |
| 6,921,788 B1 | 7/2005 | Izawa et al. | |
| 6,923,923 B2 | 8/2005 | Cheon et al. | |
| 6,951,666 B2 | 10/2005 | Kodas et al. | |
| 6,972,256 B2 | 12/2005 | Fukunaga et al. | |
| 7,002,297 B2 | 2/2006 | Aoki et al. | |
| 7,004,994 B2 | 2/2006 | Hampden-Smith et al. | |
| 7,007,370 B2 | 3/2006 | Gracias et al. | |
| 7,033,667 B2 | 4/2006 | Voss-Kehl et al. | |
| 7,053,126 B2 | 5/2006 | Yukinobu et al. | |
| 7,129,277 B2 | 10/2006 | Baran, Jr. | |
| 7,252,699 B2 | 8/2007 | Perry et al. | |
| 7,736,693 B2 * | 6/2010 | Garbar et al. | 427/180 |
| 2003/0063155 A1 | 4/2003 | Nakao et al. | |
| 2003/0110978 A1 | 6/2003 | Abe et al. | |
| 2003/0116057 A1 | 6/2003 | Suzuki et al. | |
| 2003/0124259 A1 | 7/2003 | Kodas et al. | |
| 2003/0146019 A1 | 8/2003 | Hirai | |
| 2003/0148024 A1 | 8/2003 | Kodas et al. | |
| 2003/0170448 A1 | 9/2003 | Yukinobu et al. | |
| 2003/0180451 A1 | 9/2003 | Kodas et al. | |
| 2003/0180511 A1 | 9/2003 | Yukinobu et al. | |
| 2004/0004209 A1 | 1/2004 | Matsuba et al. | |
| 2004/0019143 A1 | 1/2004 | Koloski et al. | |
| 2004/0043691 A1 | 3/2004 | Abe et al. | |
| 2004/0091731 A1 | 5/2004 | Tofuku et al. | |
| 2004/0112175 A1 | 6/2004 | Ishihara et al. | |
| 2004/0180988 A1 | 9/2004 | Bernius et al. | |
| 2004/0191641 A1 | 9/2004 | Ray et al. | |
| 2005/0136638 A1 | 6/2005 | Voss-Kehl et al. | |
| 2005/0199860 A1 | 9/2005 | Yukinobu et al. | |
| 2005/0214522 A1 | 9/2005 | Yukinobu et al. | |
| 2005/0215689 A1 | 9/2005 | Garbar et al. | |
| 2005/0287348 A1 | 12/2005 | Faler et al. | |
| 2006/0001726 A1 | 1/2006 | Kodas et al. | |
| 2006/0016371 A1 | 1/2006 | Yadav | |

FOREIGN PATENT DOCUMENTS

| | | |
|---|---|---|
| EP | 1 323 793 | 7/2003 |
| EP | 1 628 310 | 2/2006 |
| JP | 10-101123 | 4/1998 |
| JP | 10-142401 | 5/1998 |
| WO | 01/30520 | 5/2001 |
| WO | 03/038002 | 5/2003 |
| WO | 03/106573 | 12/2003 |
| WO | 04/000491 | 12/2003 |
| WO | 2004/005413 | 1/2004 |
| WO | 2004/052559 | 6/2004 |
| WO | 2005/014889 | 2/2005 |
| WO | 2005/101427 | 10/2005 |
| WO | 2005/115637 | 12/2005 |

OTHER PUBLICATIONS

Alger, "Polyethylene terephthalate," *Polymer Science Dictionary*, 2nd Edition, p. 414, 1997.

Curtis et al., "Metallizations by Direct-Write Inkjet Printing," *NCPV Program Review Meeting*, Oct. 1, 2001, Lakewood, CO, pp. 249-252.

Fuller et al., "Ink-Jet Printed Nanoparticle Microelectromechanical Systems," *J. Microelectromech. Sys.*, 2002, 11(1):54-60.

Ge and Brus., "Evidence for Spinodal Phase Separation in Two-Dimensional Nanocrystal Self-Assembly", *J. Phys. Chem. B*, 2000, 104 (41): 9573-9575.

Maillard et al., "Rings and Hexagons Made of Nanocrystals: A Marangoni Effect", *J. Phys. Chem. B*, 2000, 104:11871-11877.

Rabani et al., "Drying-Mediated Self-Assembly of Nanoparticles," *Nature*, 2003, 426: 271-274.

Reshamwala and Tendolkar, "Linear shrinkage in the sintering of compacts from activated powder," *Powder Metallurgy and Metal Ceramics*, Springer, New York, 1970, 9(3): 260-265.

Science Stuff Inc., MSDS [retrieved on Feb. 22, 2007]. Retrieved from the Internet: <URL: http://www.sciencestuff.com/msds/C1143.html>, 2 pages, Sep. 2005.

Stowell and Korgel, "Self-Assembled Honeycomb Networks of Gold Nanocrystals," *Nano Letters*, 2001, 1(11): 595-600.

Tang et al., "Gas-Liquid-Solid Phase Transition Model for Two-Dimensional Nanocrystal Self-Assembly on Graphite," *J. Phys. Chem. B*, 2002, 106(22): 5653-5658.

Teng and Vest, "A Microprocessor-Controlled Ink Jet Printing System for Electronic Circuits," *IEEE Transactions on Industrial Electronics*, 1988, 35(3):407-412.

Teng and Vest, "Application of Ink Jet Technology on Photovoltaic Metallization," *IEEE Electron Device Letters*, 1988, 9(11):591-592.

Vest et al., "Ink Jet Printing of Hybrid Circuits," *Int'l. J. Hybrid Microelectronics*, 1983, 6(1):261-267.

Wuelfing et al., "Monolayer-Protected Clusters: Molecular Precursors to Metal Films," *Chem. Mater.*, 2001, 13:87-95.

* cited by examiner

ENHANCED TRANSPARENT CONDUCTIVE COATINGS AND METHODS FOR MAKING THEM

CROSS-REFERENCE TO RELATED APPLICATIONS

This application is a National Stage application under 35 U.S.C. §371 and claims benefit under 35 U.S.C. §119(a) of International Application No. PCT/US2006/022456 having an International Filing Date of Jun. 9, 2006, which claims benefit of 60/690,062 filed on Jun. 10, 2005.

FIELD OF THE INVENTION

This invention relates to improved transparent conductive coatings containing metal nano-powder and methods for making them.

BACKGROUND

U.S. patent application Ser. Nos. 11/010,947, 11/010,948, and 11/010,949, all filed on Dec. 13, 2004, and incorporated herein by reference, describe a method of producing conductive and transparent coatings comprising metal nano-powders. The method comprises the steps of (i) admixing metal nano-powder in a solvent with a least one ingredient of the group: binder, surfactant, additive, polymer, buffer, dispersant and/or coupling agent to obtain an homogenized mixture; (ii) admixing the homogenized mixture with water or a water-miscible solvent or a mixture of water-miscible solvents to form a W/O type emulsion; (iii) applying the emulsion to a surface to be coated by various techniques such as screen printing, spreading, spin coating, dipping, etc.; (iv) evaporating the solvent from the emulsion; and (v) sintering the coated layer so a conductive and transparent coating is formed on the surface of the substrate.

In one embodiment of the transparent conductive coatings described in the aforementioned patent applications, the solvent in the homogenized mixture is an organic solvent or mixture of organic solvents having an evaporation rate that is higher than the evaporation rate of water. The resulting coating is in the form of an ordered or random conductive pattern, wherein the pattern is obtained spontaneously or as the result of a printing technique. While the conductivity of these coatings is surprisingly high, it is desirable in some cases to enhance the conductivity to more closely achieve the conductivity of bulk silver without adversely affecting the optical properties of the coating. It is also desirable in some cases to improve the stability of the emulsion prior to coating.

SUMMARY

The present invention relates to enhancing the properties of transparent conductive coatings formed from nano-metal powders. In one aspect of the invention, the conductivity of the coating is enhanced by electroplating, such as copper or nickel electroplating. A further aspect of the invention relates to a method of enhancing the conductivity of the coating comprising: (i) depositing a photoresist material on the coated transparent film, filling the openings in the conductive pattern and covering the nano-metal pattern; (ii) irradiating the film through the uncoated side in such a manner that only the photoresist material that has been deposited in the openings of the pattern is exposed; (iii) washing or etching the unexposed photoresist material, leaving the nano metal pattern uncovered; (iv) subjecting the coating to the electroplating process; and (v) washing or etching the rest of the photoresist from the film.

Another aspect of the invention relates to improving the stability of emulsions used to the form the transparent conductive coatings through the use of stabilizers such as oleic acid or sorbitan trioleate (Span 85).

Another aspect of the invention relates to optimizing the formulations for application to a surface, particularly, irregular, three-dimensional surfaces, by spray-coating techniques.

Another aspect of the invention relates to the use of certain fluorinated surfactants in the emulsions.

The enhanced transparent conductive coating of the invention can be applied on different substrates such as glass, polymer films, or three dimensional devices such as boxes, containers, etc. The application methods suitable for this technology are bar coating, spray coating or any other available coating technique for liquids.

The enhanced transparent conductive coatings of the invention can be used and applied in a wide range of applications, such as electromagnetic shielding, electro-luminescence, touch screens, organic light-emitting diodes, transparent electrodes, fuel cells, solar cells, electronic devices and others.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
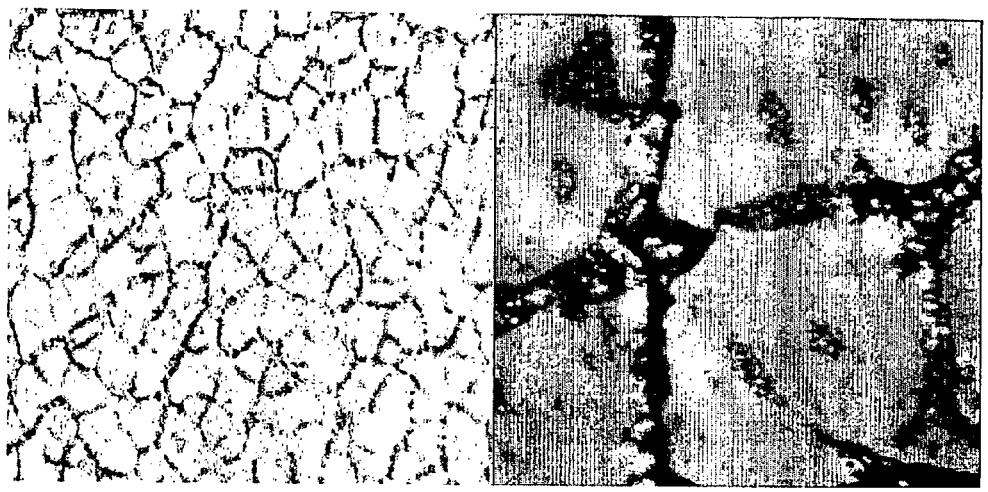
FIG. 1: Pattern with emulsion TCC-109-191-1+

The enhanced transparent conductive coatings of the present invention are based on the transparent conductive coatings described in U.S. patent application Ser. Nos. 11/010,947, 11/010,948, and 11/010,949, all filed on Dec. 13, 2004. The conductivity of these coatings is due to the presence of nano-sized metal powders. Suitable nano metal particles include silver, silver-copper alloys, silver palladium or other silver alloys or metals or metals alloys produced by the Metallurgic Chemical Process (MCP) described in U.S. Pat. No. 5,476,535 ("Method of Producing High Purity Ultra-Fine Metal Powder") and PCT application WO 2004/000491 A2 ("A Method for the Production of Highly Pure Metallic Nano-Powders and Nano-Powders Produced Thereof"). This process comprises: (a) forming an aluminum-silver alloy of a specific blend composition; (b) leaching the aluminum ingredient by a series of leaching steps wherein a fresh leaching agent is reacted with the treated solid material, providing a gradually more porous and homogeneous silver alloy. Ultrasonic oscillations are applied in step (c), disintegrating the agglomerate and enhancing the penetration of the leaching agent into the ever growing pores of the alloy by the application of a plurality of ultrasonic oscillations. The leaching agent is removed from the silver agglomerate in step (d), and then the agglomerate is washed and dried in a final step. The powders produced thereby have a "non uniform spherical" deformed ellipsoidal, worm like shape, and their chemical composition can include up to 0.4% (by weight) of aluminum, both of which are unique to this production method.

The term 'nano" as used herein refers to small particle size (D90 less than 100 nanometers).

The method for coating a substrate with the nano-metal powder comprises: (i) admixing metal nano powder in a solvent with at least one ingredient of the group: binder, surfactant, additive, polymer, buffer, dispersant and/or coupling agent in the manner a homogenized mixture is obtained; (ii) admixing the homogenized mixture with water or water miscible solvent or mixture of water miscible solvents to form a W/O type emulsion; (iii) applying the emulsion on a surface to be coated by various methods: screen printing, spreading, spin coating, dipping etc.; (iv) evaporating the solvent from the emulsion; and (v) sintering the coated layer so a conductive and transparent coating is obtained on the surface of the substrate.

The metal nano powders may be used alone or in combination with conductivity improving additives selected from at least one of the group: metal colloids and/or metal reducible salt and/or organic metal complexes and/or organo metal compounds which decompose to form conductive materials. Preferably, the concentration of the metal nano powder in the admixed solution is between 1% (wt) and 50% (wt) and more particularly, in the range of 2% (wt) to 10% (wt).

The admixed solution may comprise an organic solvent or a mixture of organic solvents. The organic solvents are characterized by an evaporation rate higher than the evaporation rate of water at ambient conditions. The concentration of the organic solvent or the mixture of organic solvents in the admixed solution is preferably between 20% (wt) and 85% (wt), more specifically, in the range 40% (wt) to 80% (wt). The solvents may be selected from at least one of the group of petroleum ether, hexanes, heptanes, toluene, benzene, dichloroethane, trichloroethylene, chloroform, dichloromethane, nitromethane, dibromomethane, cyclopentanone, cyclohexanone, UV and thermally curable monomers (e.g., acrylates), and any mixture thereof.

The concentration of the binder in the admixed solution is generally between 0% (wt) to 3% (wt). Preferably, the binder is selected from (but not limited to) ethyl cellulose and/or modified urea.

The concentration of the surfactant or surfactants mixture in the dispersed emulsion is preferably between 0% (wt) and 4% (wt). The surfactant or surfactants mixture preferably comprises at least one of the group of non-ionic and ionic compounds, selected from SPAN-20, SPAN-80, glyceryl monooleate, sodium dodecyl sulfate, and any combination thereof. It has also been found that certain fluorinated surfactants also work well in these emulsions. Examples of such fluorinated surfactants include FC 4430 available from 3M Company, and Zonyl FSH, Zonyl FS300, Zonyl FSA, Zonyl FSJ, Zonyl FS-610, Zonyl 1033-D, Zonyl FS500 and Zonyl FS510, available from Dupont.

Additionally, it has been found that the addition of certain stabilizers such as sorbitan trioleate (SPAN-85) and oleic acid can stabilize the emulsion and extend the time period before sedimentation occurs.

To achieve optimum pattern formation with the emulsion, the size distribution of the droplets in the water phase of the emulsion is preferably between 1 and 40 micrometers.

The concentration of the water miscible solvent or mixture of water miscible solvents in the dispersed emulsion is generally between about 5% (wt) and 70% (wt), and preferably between 15 (wt) and 55% (wt). The water miscible solvent or solvent mixture is preferably selected from (but not limited to) at least one of the group of water, methanol, ethanol, ethylene glycol, glycerol, dimethylformamid, dimethylacetamid, acetonitrile, dimethylsulfoxide, N-methylpyrrolidone and any mixture thereof.

The surface to be coated may be selected from paper, metal, ceramics, glass, flexible or relatively non-flexible polymeric films or sheets or any combination thereof or any other transparent or printable substrate. Polymeric films are preferably selected from the group of polyesters, polyamides, polyimides (e.g., Kapton), polycarbonates, polyethylene, polyethylene products, polypropylene, acrylate-containing products, polymethyl methacrylates (PMMA), their copolymers and any combination thereof. Additionally or alternatively, the method defined above may comprise another step of treating the surface to be coated by a means of corona treatment and/or a primer. The primer may be selected from (but not limited to) at least one of the group of 3-aminopropyl triethoxy silane, phenyl trimethoxysilane, glycidyl trimethoxysilane, commercially available Tween products, Tween-80, neoalkoxy tri(dioctylpropylphosphato) titanate, octyl triethoxy silane, and any combination thereof.

The spreading of the emulsion on a surface to be coated is provided by a means selected from simple spreading; bar spreading; immersing; spin coating; doping; dipping or any other suitable technique. Moreover, according to one embodiment of the present invention, the step of coating layer or layers provided by the spreading of the homogenized mixture on a surface to be coated is provided for a wet thickness of 1 to 200 microns, e.g., 5 to 200 microns.

It has been found that spray coating is an effective method of applying the coating to uneven surfaces and three-dimensional objects. This method can be used to make transparent conductive coatings on polymer films, glass, polycarbonate, three dimensional devices (such as boxes and containers) and other materials and devices. As illustrated below in the examples, more dilute coating formulations are preferred to achieve low resistance coatings by spray coating.

The sintering of the coated layer is preferably carried out in the temperature range of 50° C. to 300° C. for 0.5 to 2 hours. Alternatively, the sintering of the network-like pattern can be carried out in the temperature range of 50° C. to 150° C. for 2 to 30 minutes. Resistivities following sintering are between 0.005 Ω/square to 5 kΩ/square.

The sintering process may be conducted in the presence of a chemical that induces the sintering process. Examples of suitable chemicals include formic acid, acetic acid, and formaldehyde. The chemical may be in the form of a vapor or a liquid to which the deposited particles are exposed. Alternatively, it may be incorporated into the composition comprising the nano metal particles prior to deposition, or may be deposited on the nano metal particles after depositing the particles on the substrate.

The preferred transparent conductive coating layer are characterized by light transparencies in the range of 30% to 90% at 400 nm to 700 nm wavelength; resistances in the range of 0.1 Ω/square to 10 kΩ/square and by haze values in the range of 0.5% to 20%.

The conductive transparent coating layer is characterized by either an ordered or random pattern, wherein the pattern is provided by printing disposition, self-assembling or self organizing or any other suitable technique. The conductive and transparent coating layer may be further provided with a protective layer, anti-scratch layer, a layer to enhance conductivity, a layer to enhance adhesion to a surface to be coated or any combination thereof.

It has been determined that electroplating following sintering can lower the resistivity of the coatings by orders of magnitude. Electroplating can be performed, using standard procedures, on substrates coated with the transparent conductive coatings made as described above. Any type of electroplating can be performed, and the process can be applied to films with different electrical and optical properties, in which case the plating conditions may need to be adjusted. In the examples below, two types of electroplating were used: copper electroplating and nickel electroplating. Resistance of the coatings dropped significantly after electroplating.

Electroplating can also be performed on a coated film that has been treated in the following manner. A photoresist material is deposited on the coated transparent film, filling openings in the pattern and covering the nano metal pattern, using standard methods. The film is irradiated from behind (the uncoated side) in such a manner that only the photoresist material that has been deposited in the openings of the pattern is exposed. After the exposure, the unexposed photoresist material is washed or etched, leaving the nano metal pattern uncovered. This film is exposed to the electroplating process. After the electroplating process, the rest of the photoresist material is washed or etched from the coating. As a result of this process, a transparent conductive coated film is obtained with very low electrical resistance, thick lines and good optical properties.

The invention is further illustrated by the following non-limiting examples. Examples 1-3 illustrate the enhancement of conductivity by electroplating techniques. Examples 4-10 illustrate formulations of transparent conductive coating optimized for spray coating and emulsion stabilization, and Examples 11-12 illustrate formulations optimized for application to certain substrates.

Example 1

An electrolyte composition for copper plating is prepared with a composition as described in Table 1. The samples of the transparent conductive coatings used in this example and Example 2 are described in Example 27 of U.S. patent application Ser. No. 11/010,947 filed Dec. 13, 2004.

TABLE 1

Copper-Containing Electrolyte Composition.

| Component | Concentration, % |
|---|---|
| $CuSO_4 \cdot 5H_2O$ | 7.00 |
| Poly Ethylene Glycol 8000 | 0.029 |
| Sodium Dodecyl Sulfate | 0.010 |
| $H_2SO_4$ (96%) | 9.61 |
| HCl (32%) | 0.021 |
| Deionized water | 83.33 |
| Total | 100 |

In the process of copper electroplating, about a 4 dm² area of the surface of each sample is immersed into the electrolyte solution. The samples to be plated have been connected as the cathode. For the anode, a copper electrode of A4 size was used. Conditions for the copper electroplating and properties of the samples after the plating are summarized in Table 2. Optical properties are shown in Table 5.

TABLE 2

Copper Plating.

| Sample | R before plaiting, Ω/square | Electroplating time, min | Current, A | R after electroplating, Ω/square Upper side | Lower side |
|---|---|---|---|---|---|
| D140-04 | 1.0 | 5 | 0.59 | 0.08 | 0.17 |
| D140-05 | 1.0 | 5 | 0.61 | 0.07 | 0.17 |
| D140-06 | 1.0 | 5 | 0.60 | 0.08 | 0.16 |

Example 2

An electrolyte composition for nickel plating is prepared with a composition as described in Table 3. The samples of the transparent conductive coating used are described in Example 27 of U.S. patent application Ser. No. 11/010,947 filed Dec. 13, 2004.

TABLE 3

Nickel-Containing Electrolyte Composition.

| Component | Concentration, % |
|---|---|
| $NiSO_4 \cdot 6H_2O$ | 15.79 |
| $NiCl_2 \cdot 6H_2O$ | 3.126 |
| Boric acid | 1.96 |
| Sodium Dodecyl Sulfate | 0.004 |
| Deionized water | 79.12 |
| Total | 100 |

In the process of nickel electroplating, about a 4 dm² area of the surface of each sample is immersed in the electrolyte solution. The samples to be plated were connected as the cathode. For the anode, a copper electrode of A4 size was used. Conditions for the copper electroplating and properties of the samples after plating are summarized in Table 4. Optical properties are shown in Table 5.

TABLE 4

Nickel Plating.

| Sample | R before plaiting, Ω/square | Electroplating time, min | Current, A | R after electroplating, Ω/square Upper side | Lower side |
|---|---|---|---|---|---|
| D140-01 | 1.0 | 15 | 0.60 | 0.32 | 0.46 |
| D140-02 | 1.0 | 10 | 0.80 | 0.11 | 0.28 |
| D140-03 | 1.0 | 15 | 0.80 | 0.09 | 0.12 |

The electrical resistance of the transparent conductive coatings before and after the plating was measured by a MILLIOHM METER (Model: MO-2001), using a four probe method (measured on the area 2.5×2.5 cm).

TABLE 5

Optical Properties of Samples.

| Sample | Before electroplating T, % | Haze, % | Plating material | After electroplating T, % | Haze, % |
|---|---|---|---|---|---|
| D140-01 | 82.0 | 16.4 | Nickel | 79.0 | 6.3 |
| D140-02 | 81.6 | 14.5 | Nickel | 78.3 | 10.8 |
| D140-03 | 80.2 | 14.0 | Nickel | 73.9 | 11.7 |
| D140-04 | 80.6 | 11.4 | Copper | 79.3 | 5.7 |
| D140-05 | 80.6 | 20.4 | Copper | 77.5 | 6.23 |
| D140-06 | — | — | Copper | 78.5 | 7.9 |

Example 3

The same procedures as described above can be performed on a coated film which has been treated in the following manner before the plating process. A photoresist material is deposited on the coated transparent film, filling all the openings in the pattern and covering the nano silver pattern, using standard methods. The film is irradiated from behind (the uncoated side) in such a manner that only the photoresist which has been deposited in the openings of the pattern is exposed. After the exposure, the unexposed photoresist is washed or etched, leaving the nano silver pattern uncovered. This film is exposed to the electro plating process. After the electro plating process, the rest of the photoresist is washed or etched from the film. As a result of this process a transparent conductive coated film is obtained with very low electrical resistance, thick lines and good optical properties.

Example 4

An emulsion is prepared with the composition described in Table 6 according to the following procedure. All organic phase components except the cyclopentanone were mixed in the glass beaker and sonicated at 90% power for 10 sec. Then the water phase was added, mixed by hand and sonicated at 90% power for 20 sec. And finally, cyclopentanone was added and mixed by hand.

TABLE 6

Hexane-Based Formulation.

| Component | Content, % |
|---|---|
| Span-80 | 0.996 |
| BYK-411 | 0.330 |
| Hexanes | 50.84 |
| *P201 | 5.084 |
| Cyclopentanone | 7.17 |
| 0.02% water solution of BYK-348 | 35.58 |
| Total | 100 |

*P201 is a batch of silver nano-particles made by the MCP process coated with 3% Disperbyk™ 106 from Byk Chemie.

This formulation was applied by different bars directly on a polycarbonate substrate. Best results were obtained at wet thickness of 30 μm. After pattern development, samples were dried at room temperature for 10 min, heated in the oven at 140° C. for 30 min (some samples—24, 30 and 34 μm coated—were conductive, just after this heating, at the level of 60-100 Ω/square), treated in formic acid vapors at 85° C. for 15 min and dried at 100° C. for 10 min. The formulation applied on polycarbonate by sprayer for TLC (supplier—Merck) didn't give a regular network pattern. To optimize this emulsion for spray coating, the emulsion is diluted by hexanes and cyclopentanone. Also 0.02% water solution of BYK-348 was substituted by pure water. This water phase substitution gives better pattern development by bar coating. The obtained formulation is summarized in the Table 7.

TABLE 7

The Diluted Hexane-Based Formulation (TCC-109-191-1+).

| Component | Content, % |
|---|---|
| Span-80 | 0.680 |
| BYK-411 | 0.230 |
| Hexanes | 56.32 |
| P201 | 3.70 |
| Cyclopentanone | 7.66 |
| Water | 31.41 |
| Total | 100 |

This formulation (TCC-109-191-1+) gave small areas of developed pattern on polycarbonate after spray coating, but drying of the organic phase from drops in the coating process was still significant. But a "rinse coating"—simple rinsing of substrate by the formulation—gave an acceptable pattern. Optical microscope images of "rinse coated" sample are presented FIG. 1.

Improved and more defined patterns can be obtained by spraying in an atmosphere saturated by hexane vapors.

Example 5

A formulation having the composition described in Table 8 was made by the following procedure. All organic phase components except for ~40% of the cyclohexanone were mixed in the glass beaker and sonicated at 90% power for 10 sec. The water phase was then added, mixed by hand and sonicated at 90% power for 20 sec. Finally the remaining cyclohexanone was added and mixed by hand.

TABLE 8

The Starting Heptane-Based Formulation (TCC-117-5-3).

| Component | Content, % |
|---|---|
| Span-80 | 0.876 |
| BYK-411 | 0.294 |
| Heptane | 49.15 |
| P201 | 4.55 |
| Cyclohexanone | 4.94 |
| Water | 40.19 |
| Total | 100 |

This formulation was applied by 40 μm bar directly on a polycarbonate substrate, and developed good pattern. The formulation applied on polycarbonate by sprayer didn't give a regular network pattern. After dilution of the initial formulation by heptane and cyclohexanone in different proportions, spraying techniques also started to give a network pattern on polycarbonate. But reproducibility of pattern formation was too low and conductive lines had many disconnections. As a result, samples had very high electrical resistance after sintering. Also the stability of the emulsion was too low (less than 10 min). To improve the properties of the formulation, a formulation with the composition described in Table 9 was made and tested. The surfactant (Span-80) concentration was increased to improve the emulsion stability and film formation. The metal concentration also was increased to improve conductance of the formed pattern.

TABLE 9

The New Starting Heptane-Based Formulation (TCC-117-9-1).

| Component | Content, % |
|---|---|
| Span-80 | 1.440 |
| BYK-411 | 0.320 |
| Heptane | 47.86 |
| P201 | 5.504 |
| Cyclohexanone | 6.206 |
| Water | 38.67 |
| Total | 100 |

This formulation was prepared in the same manner as TCC-177-5-3, and after bar coating (40 μm wet layer) an acceptable pattern was formed on polycarbonate. The emulsion was much more stable than the previous formulation (~1 hour), but spray coating of this formulation on polycarbonate didn't give a pattern. After dilution of this formulation by heptane and cyclohexanone (See the formulation in Table 10) and spray coating, a pattern was obtained.

TABLE 10

The Heptane-Based Formulation Diluted for Spray Coating (TCC-117-9-2).

| Component | Content, % |
|---|---|
| Span-80 | 0.949 |
| BYK-411 | 0.211 |
| Heptane | 64.01 |
| P201 | 3.62 |
| Cyclohexanone | 5.76 |
| Water | 25.45 |
| Total | 100 |

Samples were not conductive after sintering at 140° C. for 30 min. Samples were exposed to formic acid vapors at 90° C. for 15 min., after which the electrical resistance of the samples was below 10 Ω/square.

Example 6

A formulation with the composition described in Table 11 was made according to the following procedure and tested. All organic phase components except for cyclohexanone were mixed in the glass beaker and sonicated at 90% power for 10 sec. The water phase was then added, mixed by hand and sonicated at 90% power for 20 sec. Finally, cyclohexanone was added and mixed by hand.

TABLE 11

Heptane-Based Formulation for Bar Coating. (TCC-117-13-1)

| Component | Content, % |
|---|---|
| Span-80 | 0.897 |
| BYK-411 | 0.311 |
| Heptane | 46.93 |
| P201 | 4.97 |
| Cyclopentanone | 5.67 |
| Cyclohexanone | 1.812 |
| Water | 39.41 |
| Total | 100 |

This formulation was applied by 40 μm bar directly on polycarbonate and developed good pattern. This formulation, before adding the cyclohexanone was relatively stable (more than 2 hours). Spray coating by using this formulation was not successful. For spray coating, this formulation was diluted by heptane, cyclopentanone and cyclohexanone. The final formulation is summarized in the Table 12.

TABLE 12

Heptane-Based Formulation for Spray Coating. (TCC-117-13-2)

| Component | Content, % |
|---|---|
| Span-80 | 0.489 |
| BYK-411 | 0.170 |
| Heptane | 69.05 |
| P201 | 2.712 |
| Cyclopentanone | 4.123 |
| Cyclohexanone | 1.966 |
| Water | 21.49 |
| Total | 100 |

Figure 2:
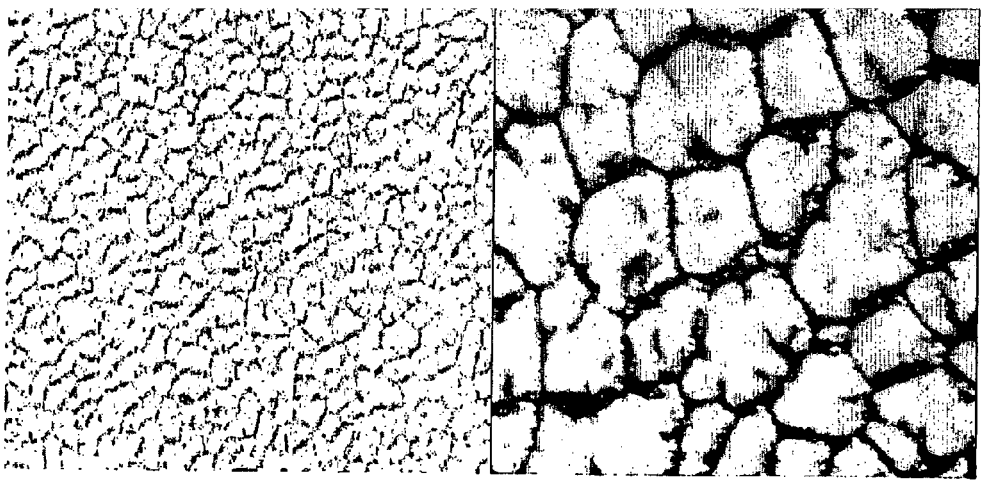
FIG. 2: Pattern with emulsion TCC-117-13-2

This formulation gives an acceptable pattern on spray-coated polycarbonate. After pattern development, samples were dried at room temperature for 10 min and heated in the oven at 140° C. for 30 min. Electrical resistance of the samples was 15-20 Ω/square. Optical microscope images of the sample spray-coated by TCC-117-13-2 formulation are presented in FIG. 2.

Figure 3:
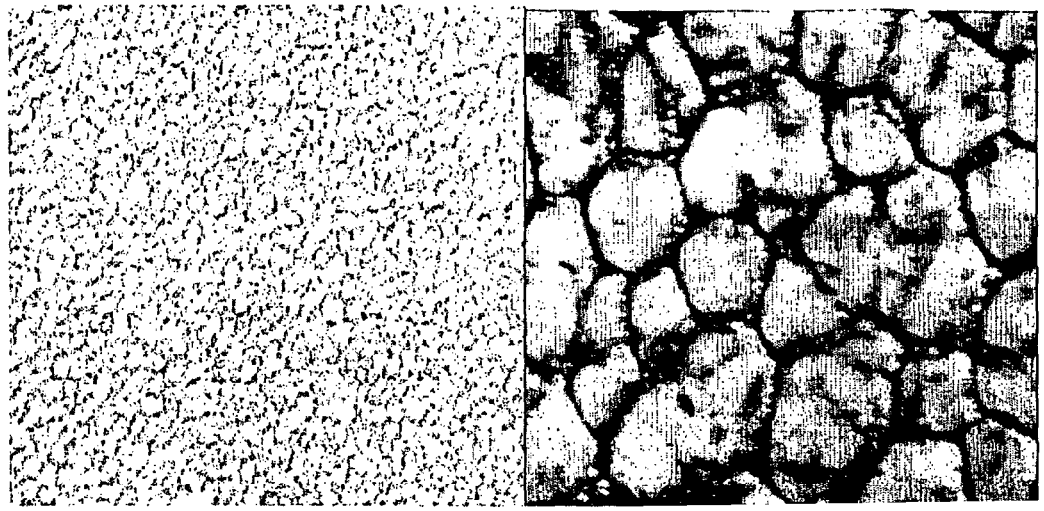
FIG. 3: Pattern with emulsion TCC-117-14-1

This final formulation is also reproducible. The second experiment with the same formulation coded TCC-117-14-1 gave samples with electric resistance after sintering at 140° C. for 30 min of 23-35 Ω/square. Optical microscope images of the sample spray-coated with the TCC-117-14-1 formulation are presented in FIG. 3.

The described formulation has low stability. Sedimentation of water droplets occurred very fast (minutes) especially after preparation of the formulation using a rotor-stator homogenizer (Kinematica). For instance in the formulation, which has been prepared by dispersing of the powder in organic phase for 3 min at 35 KHz (approximately 7000 rpm) and after addition of water homogenizing for 3 min at the same conditions without cooling, sedimentation occurred in 2 minutes. Cooling by circulating in double jacket of chilling mixture at temperature ~0° C. improved the stability of obtained emulsion. In this case sedimentation occurs in 10 min. After simple shaking, the formulation was suitable for spraying and pattern formation on polycarbonate. But in this case, the sprayed formulation should be permanently stirred.

Example 7

A formulation with the composition described in Table 13 was made according to the procedure describe above (Example 6) and tested.

TABLE 13

Heptane-Based Formulation stabilized by oleic acid for spray coating. (D113-131-02)

| Component | Content, % |
|---|---|
| Span-80 | 0.480 |
| BYK-411 | 0.167 |
| Oleic Acid | 0.103 |
| Heptane | 68.40 |
| P201 | 2.700 |
| Cyclopentanone | 4.890 |
| Cyclohexanone | 1.984 |
| Water | 21.276 |
| Total | 100 |

This formulation is more stable. The sedimentation occurs only after 1.5-2 hours. Spraying of the formulation on polycarbonate gives acceptable pattern, but after sintering at 140° C. for 30 min., sheet resistance of samples was 190-500 Ω/square. An additional 30 min of sintering at the same temperature lowers the resistance to values to 95-170 Ω/square.

Example 8

A formulation having the composition described in Table 14 was made according to the procedure describe above (Example 7) and tested.

TABLE 14

Heptane-Based Formulation Stabilized by Span-85 for Spray Coating. (D113-131-01)

| Component | Content, % |
|---|---|
| Span-80 | 0.494 |
| BYK-411 | 0.142 |
| Span-85 | 0.100 |
| Heptane | 69.15 |
| P201 | 2.766 |
| Cyclopentanone | 3.457 |
| Cyclohexanone | 2.386 |
| Water | 21.505 |
| Total | 100 |

The sedimentation of this formulation (D113-131-01) occurs after 40-60 min. Spraying of the formulation on polycarbonate gave an acceptable pattern. After sintering at 140° C. for 30 min., sheet resistance of samples was 21-38 Ω/square. The formulation may be used for spraying even after sedimentation, but after simple shaking repeated sedimentation occurs in 10 min. Short sonication or homogenizing by a rotor-stator homogenizer, reconstructs the initial emulsion with stability for 40-60 min.

The above formulation D113-131-01 was also prepared in bigger quantities as follows. Five portions of 1 Kg (~1.2 L) each were prepared using a Rotor-stator homogenizer (Kinematika) for the preparation. First, silver powder was dispersed in the organic phase at 35 KHz (~7000 rpm) for 3 min in a cooled vessel. After addition of water, the emulsion was homogenized for 3 min at the same conditions. Each portion of the emulsion was tested by spraying on a polycarbonate substrate. Obtained samples were sintered at 140° C. for 30 min. The sheet resistance of the samples was 21-38 Ω/square.

1 L of the emulsion was re-emulsified after 1 day of standing and settling by homogenizing for 3 min at conditions described above. The reconstructed emulsion gave an acceptable pattern after spraying on polycarbonate. When sintered at standard conditions, samples had a resistance of 22-27 Ω/square.

Example 9

A formulation having the composition described in Table 15 was made according to the procedure describe above (Example 6) and tested.

TABLE 15

The Newly-Developed Formulation CE103-1.

| Component | Content, % |
|---|---|
| Span-80 | 0.468 |
| BYK-411 | 0.167 |
| Span-85 | 0.100 |
| Heptane | 66.867 |
| *440-O52-2.5% (AS2063) | 3.009 |
| **440-O52-2.0% (AS2063) | 3.009 |
| Cyclopentanone | 3.343 |
| Cyclohexanone | 2.307 |
| Water | 20.73 |
| Total | 100 |

*Silver nano-particles made by the MCP process and coated with 2.5% Disperbyk ™ 106.
**Silver nano-particles made by the MCP process and coated with 2.0% Disperbyk ™ 106

5.25 L of the formulation CE103-1 were prepared (Lot E107) in 1.5 Kg (~1.75 L) batches. Rotor-stator homogenizer (Kinematika) was used for the preparation. First, silver powders were dispersed in the organic phase at 35 KHz (~7000 rpm) for 5 min in a cooled vessel. After addition of water, the emulsion was homogenized for 5 min at the same conditions. Each portion of the emulsion was tested by spraying on a polycarbonate substrate. Obtained samples were sintered at 140° C. for 30 min. The sheet resistance of the samples was 16-24 Ω/square. Thirty ml of the emulsion was re-emulsified after 1 day of standing and settling by sonication at 90% power for 20 sec. The reconstructed emulsion gave an acceptable pattern after spraying on polycarbonate. Sintered at standard conditions, samples had a resistance of 24-32 Ω/square.

Example 10

A more concentrated emulsion was developed that enabled bar coating, spray coating after dilution and sintering at 130° C.

The composition of this concentrated formulation is summarized in Table 16. The formulation is suitable for bar coating with 80 µm bar. Bar coated samples sintered at 140° C. for 30 min showed sheet resistance 10-16 Ω/square. The formulation, diluted by 25% of heptane and sprayed on a polycarbonate substrate, produced a good pattern, and samples sintered at 140° C. for 30 min showed sheet resistance of 20-24 Ω/square. The formulation diluted by 50% of heptane and sprayed on a polycarbonate substrate gave an acceptable pattern, and samples sintered at 140° C. for 30 min showed a sheet resistance 40-80 Ω/square.

TABLE 16

Concentrated Emulsion for Bar Coating CE103-2.

| Component | Content, % |
|---|---|
| Span-80 | 0.572 |
| BYK-411 | 0.205 |
| Span-85 | 0.121 |
| Heptane | 58.735 |
| 440-O52-2.5% (AS2063) | 7.514 |
| Cyclopentanone | 4.174 |
| Cyclohexanone | 2.839 |
| Water | 25.840 |
| Total | 100 |

1.3 Kg of the formulation CE103-1 was prepared (Lot E108). Rotor-stator homogenizer (Kinematika) was used for the preparation. First, silver powder was dispersed in an organic phase at 35 KHz (7000 rpm) for 5 min in a cooled vessel. After addition of water, the emulsion was homogenized for 5 min at the same conditions. Coating of a polycarbonate substrate by 80µ bar gave good samples. These samples were sintered at 140° C. for 30 min. The sheet resistance of the samples was 16 Ω/square. A portion of Lot E108 was diluted by 25% heptane. This diluted emulsion was sprayed on polycarbonate and gave samples with good pattern. The sheet resistance of samples sintered at 140° C. for 30 min was 26Ω/square.

This emulsion was used to coat polycarbonate film and sintered at 140° C. and 130° C. in a convection oven. Time of sintering in both cases was 30 min. Results are summarized in the Table 17.

These emulsions described above produce thicker lines in the self assembled patterned formed.

TABLE 17

Resistance Results

| Cat. No | Lot | Coating type | Resistance after sintering at 140° C., Ω/square | Resistance after sintering at 130° C., Ω/square | Resistance after sintering at 130° C. for 15 min, Ω/square |
|---|---|---|---|---|---|
| CE103-1 | E107 | Spray | 16-20 | 25-31 | No data |
| CE103-2 | E108 | Bar, 80μ | 12-18 | 16-24 | ~40 |
|  |  | Spray after dilution by 25% of Heptane | 24-32 | 40-60 | ~90 |

Example 11

The emulsion having the composition described in Table 18 produces a self assembled conductive transparent pattern on PET film commercially-available as U34 film from Toray Industries, Japan. This same formulation also forms a pattern on Axton film of JSR, Japan.

TABLE 18

Content of 117-68-2 Formulation.

| Component | Concentration, % |
|---|---|
| BYK-411 | 0.30 |
| Span-80 | 1.37 |
| Cyclopentanone | 5.66 |
| Cyclohexanone | 3.04 |
| Heptane | 46.83 |
| P201 | 4.68 |
| 0.05% Copper sulfate solution in water | 38.12 |
| Total | 100 |

Figure 4:
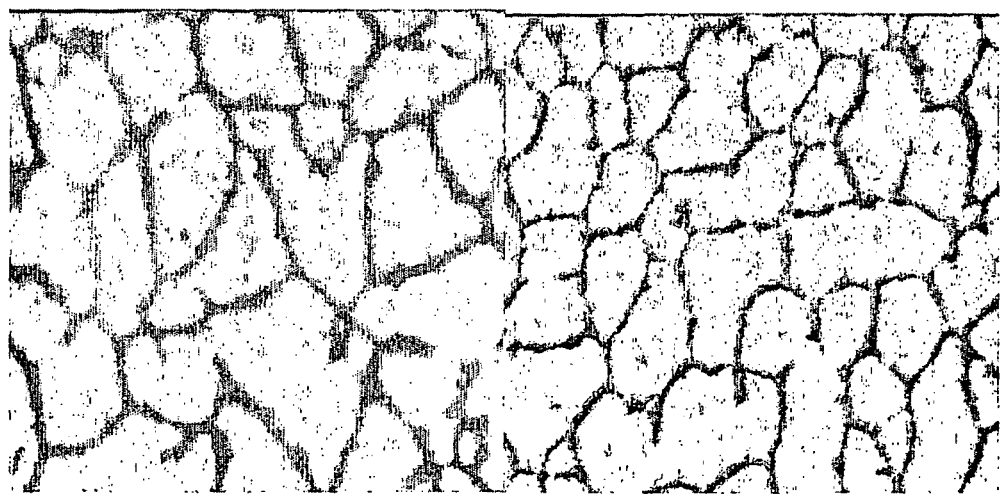
FIG. 4: Pattern on PET film with emulsions 36-02-01 and 36-02-02 (40µ bar)
Figure 5:
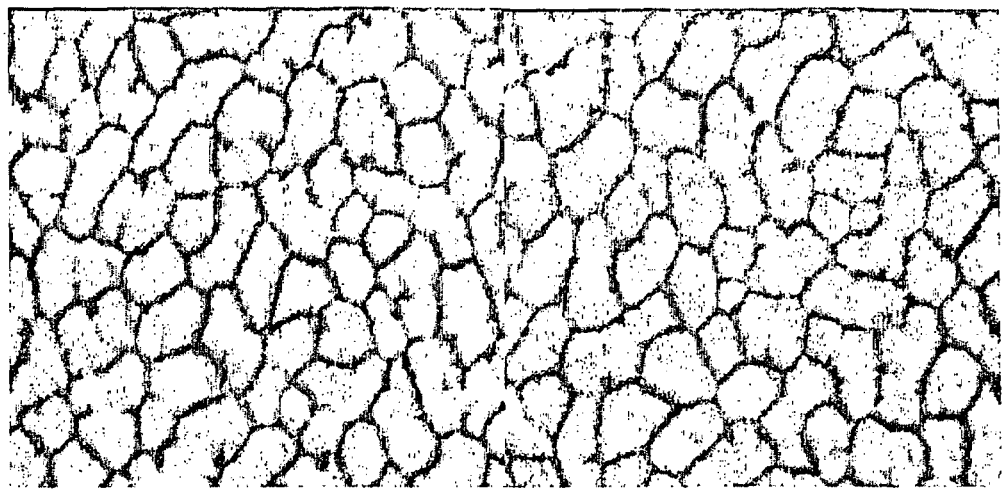
FIG. 5: Pattern on PET film (primed with 1% octyl triethoxy silane) with emulsions 117-68-2-1 and 117-68-2-2

The above described formulation, when applied to the PET film by bar coating, bar No. 4 (40μ), produced a conductive transparent coating. See FIG. 4. It was found that using 1% octyl triethoxy silane in hexanes as a primer improves the pattern. The primer was prepared by applying of 1% octyl triethoxy silane solution in hexanes on the film by 40μ bar, drying of the primer and then applying of the formulation by the same bar. See FIG. 5.

Both samples described above after sintering at 150° C. for 30 min had a resistance above 2000 μ/square. Exposing the patterns to formic acid vapors at 90° C. for 15 min reduced the resistance to low values. Optical and electric properties of the samples are summarized in table 19.

TABLE 19

Optical and Electrical Properties of Samples on PET Substrate.

| Sample | Resistance, Ω/square | Transmittance, % | Haze, % |
|---|---|---|---|
| 36-02-01 | 10.2 | 60.8 | 27.4 |
| 36-02-02 | 5.9 | 60.8 | 25.4 |
| 117-68-2-1 | 8.0 | 59.4 | 19.7 |
| 117-68-2-2 | 8.4 | 58.4 | 20.8 |

Applying the above-described formulation on a different polyester film (U426 from Toray Industries) also gave a network pattern, but open areas were filled by metal particles.

Example 12

The emulsion having the composition described in Table 20 (produced by the same method as described in Example 4) produces a self assembled conductive transparent pattern on the PET film.

TABLE 20

Content of E47-1A.

| Component | Concentration, % |
|---|---|
| BYK-410 | 0.11 |
| Span-80 | 0.11 |
| Dichloroethane | 76.63 |
| Cyclohexanone | 0.42 |
| P201 | 3.59 |
| Water (0.02% Byk 348) | 19.98 |
| FC 4430 (3M material) | 0.08 |
| Butvar B-76 | 0.08 |
| Total | 100 |

Figure 6:
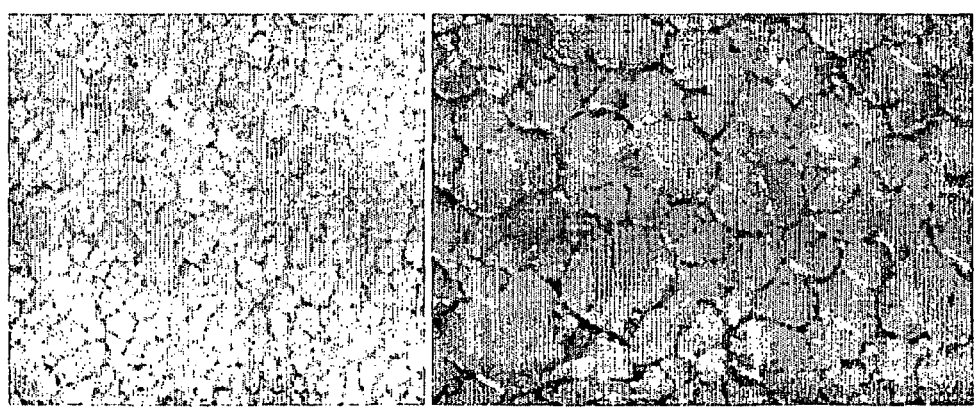
FIG. 6: Pattern on PET film with emulsions E46-1A

The above described formulation, when applied on the PET film by bar coating (30μ), produced a conductive transparent coating. See FIG. 6. Other fluoro surfactants like FC 4430 also performed in this system like FC-4432, and also Zonyl FSH, Zonyl FS300, Zonyl FSA, Zonyl FSJ, Zonyl FS-610, Zonyl 1033-D, Zonyl FS500, Zonyl FS510 from Dupont and others. Additional binders instead of Butvar B-76 that can be used in this system are Butvar B-79, Butvar B-90, Butvar B-92, Butvar-B94, Butvar B-96, Butvar B-98 (Solutia), UCAR VROH. VAGC and others.

Exposing the patterns to formic acid vapors at 90° C. for 15 min reduces resistance to low values, 3.6 μ/square. Also good adhesion and cohesion are obtained with this formulation.

A number of embodiments of the invention have been described. Nevertheless, it will be understood that various modifications may be made without departing from the spirit and scope of the invention. Accordingly, other embodiments are within the scope of the following claims.

What is claimed is:

1. A method of forming a transparent conductive coating on a substrate comprising;
    a. admixing metal nanopowder in a solvent with at least one ingredient of the group consisting of binder, surfactant, additive, polymer, buffer, dispersant and/or coupling agent to form an homogenized mixture;
    b. admixing the homogenized mixture with water or a water miscible solvent or mixture of solvents to form an emulsion;
    c. applying the emulsion on a surface of a substrate to be coated;
    d. evaporating the solvent from the coated emulsion;
    e. sintering the coated layer to form a conductive pattern comprising a network of thin, interconnected metal traces defining openings on the substrate; and
electroplating the conductive pattern with an electrolyte composition containing metal ions
wherein the following steps are added before the electroplating step:
    (i) depositing a photoresist material on the transparent conductive coating, filling the openings in the pattern and covering the conductive pattern;
    (ii) irradiating the photoresist material through the substrate in a manner that only the photoresist material in the openings of the pattern is exposed; and
    (iii) washing away the unexposed photoresist material;
and wherein the remainder of the photoresist is removed from the coating after electroplating.

2. The method of claim 1 wherein the metal ions comprise copper ions.

3. The method of claim 1 wherein the metal ions comprise nickel ions.

* * * * *